United States Patent [19]
Takashima

[11] Patent Number: 6,068,137
[45] Date of Patent: May 30, 2000

[54] SEMICONDUCTOR WAFER CARRIER

[75] Inventor: Chikayuki Takashima, Taku, Japan

[73] Assignee: Sumitomo Metal Industries, Ltd., Osaka, Japan

[21] Appl. No.: 09/297,258

[22] PCT Filed: Sep. 16, 1997

[86] PCT No.: PCT/JP97/03261

§ 371 Date: Jun. 11, 1999

§ 102(e) Date: Jun. 11, 1999

[87] PCT Pub. No.: WO99/14795

PCT Pub. Date: Mar. 25, 1999

[51] Int. Cl.⁷ .................................................. A47F 7/00
[52] U.S. Cl. ........................ 211/41.18; 206/454; 134/902; 118/500
[58] Field of Search ........................ 211/41.18; 206/454; 118/500; 134/902

[56] References Cited

U.S. PATENT DOCUMENTS

| | | | |
|---|---|---|---|
| 3,923,156 | 12/1975 | Wallestad | 206/454 |
| 5,290,835 | 3/1994 | Hatayama et al. | |
| 5,370,142 | 12/1994 | Nishi et al. | 118/500 X |
| 5,577,610 | 11/1996 | Okuda et al. | 206/454 |
| 5,730,162 | 3/1998 | Shindo et al. | 134/902 X |
| 5,780,127 | 7/1998 | Mikkelsen | 206/454 X |

FOREIGN PATENT DOCUMENTS

| | | |
|---|---|---|
| 0540289 | 5/1993 | European Pat. Off. . |
| 63-039955 | 2/1988 | Japan . |

OTHER PUBLICATIONS

Database WPI, Section EI, Week 9751, Derwent Pub. Ltd., London, Class U11, AN 97–556806 XP002058043, JP09270460 (Sumitoano), Oct. 1997.

*Primary Examiner*—Robert W. Gibson, Jr.
*Attorney, Agent, or Firm*—Breiner & Breiner

[57] ABSTRACT

The object of this invention is to reduce adhesion of resin in a resin-made carrier used when washing, conveying and transporting semiconductor wafers, and it is characterized in that the carrier is made from PBN having an elongation rate of 100% or less, whereby adhesion of resin is reduced to a minimum compared to a conventional wafer carrier manufactured from PFA.

1 Claim, 1 Drawing Sheet

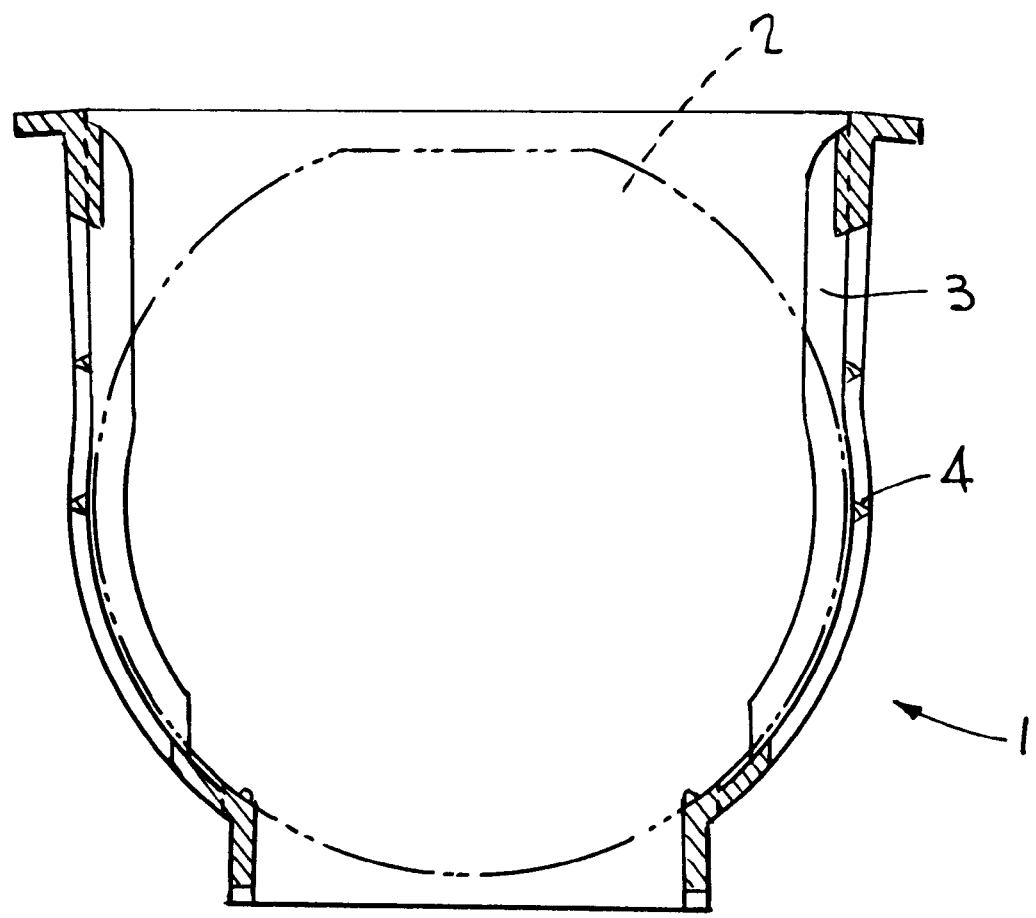

SEMICONDUCTOR WAFER CARRIER

FIELD OF THE INVENTION

This invention relates to a carrier for washing, conveying and transporting semiconductor wafers, which holds semiconductor wafers in a washing process following mirror polishing of the semiconductor wafers, and more particularly, to a semiconductor wafer carrier having a prescribed tensile elongation rate and tensile strength, whereby adhesion of resin during contact is reduced as far as possible.

BACKGROUND OF THE INVENTION

Semiconductor wafers such as silicon wafers which require a high degree of cleanliness are subjected to a variety of washing processes. For example, to describe a general immersion washing method, fine particles and organic material are removed by washing using ammonium hydroxide and aqueous hydrogen peroxide, the washing solution is removed by rinsing with pure water, contamination by metallic impurities incorporated in the natural oxide film generated during washing are removed by an acid or an alkali washing process, and the washing solution is removed by rinsing with pure water, whereupon the wafers are dried by centrifugal drying.

In any washing method, such as chemical washing, water washing, or the like, a carrier 1, as shown in the sole FIGURE for holding the semiconductor wafers 2 during washing provided with a plurality of slits 3 allowing the washing solution to contact all parts of the wafers is used, such that a plurality of semiconductor wafers can be processed simultaneously, and this holding carrier can also be used in this state during centrifugal drying. Conventionally, such carriers used in a washing process have been made from PFA (tetrafluoroethylene perfluoroalkylvinyl ether copolymer). Specifically, since PFA has excellent thermal resistance and chemical resistance, there is no change in the properties of the PFA carrier due to rise in temperature in the washing solution or infiltration of chemical solution during the washing process, and there is no liquation of impurities, and therefore carriers made from PFA are generally used at present.

However, PFA carriers of this kind are relatively soft and have a tensile elongation rate of 300% (test method: ASTM D638). In the drying method in the final washing stage for the semiconductor wafers, generally, a spin dryer is used. This spin dryer drying method expels water by centrifugal separation at approximately 1,000 rpm.

When the wafers and carrier are dried by this drying method, during rotation the wafers rise up due to centrifugal force and strongly contact the resin in the holding groove sections of the carrier. Since the PFA resin is relatively soft, as described previously, resin adheres to the wafers at the portions in contact with the wafers.

This resin that adheres to the wafers may cause particle contamination during preliminary washing before device processing, or diffusion of impurities into the wafers during heat treatment. For example, this preliminary washing may involve washing by etching to remove natural oxide films, and the drying method may involve drying by evaporation. In this case, if PFA resin adhering to the wafer is peeled off by the chemical solutions and floats about during drying by evaporation, whereupon it adheres once again to the wafer surface, then irregular growth will occur in the areas where the resin adheres when heat treatment is performed.

Furthermore, semiconductor wafers which have completed the mirror polishing and washing processes may be transported a long distance before entering device processing, and carriers comprising a resin-made holding frame provided with a plurality of U-shaped grooves for holding a plurality of wafers independently in an upright position are accommodated in a transporting vessel, and a resin-made wafer 4 as shown in the sole FIGURE press is used to prevent the wafers moving inside the grooves due to vibrations. However, during this transportation stage, the wafers rub against the resin due to vibrations, and the like, and resin from the carrier and the wafer press may adhere to the wafers.

BRIEF DESCRIPTION OF THE INVENTION

In view of the foregoing problems associated with resin-made carriers during washing, conveyance and transportation of semiconductor wafers, it is an object of the present invention to provide a semiconductor wafer carrier whereby adhesion of resin which may cause contamination in subsequent processing stages is significantly reduced.

As a result of various research aimed at finding a resin having excellent properties in terms of thermal resistance and resistance to chemicals such that it can withstand alkali washing or the like as demanded in a semiconductor wafer carrier, excellent wear resistance in order to eliminate adhesion of resin, and high strength, the present inventors discovered that a carrier made from PBN, which has a tensile elongation rate of 100% or less is most suitable for this use.

BRIEF DESCRIPTION OF THE DRAWING

The sole FIGURE (as referred to above) illustrates a cross-section of a semiconductor wafer carrier 1 which exemplifies a carrier of the present invention. The carrier 1 holds a wafer 2 positioned in slits 3 and between wafer presses 4.

DESCRIPTION OF PRESENTLY PREFERRED EMBODIMENTS

The PBN (polybutylene naphthalate) resin used in this invention has a tensile elongation rate of 100% or less (test method: ASTM D638), a tensile strength of 500 kg/mm$^2$ or above, a thermal deformation temperature of 70° C. or above (test method: ASTM D648), a melting point of 240° C. or above, and an electrostatic tangent in the range of $4 \times 10^{-3} \sim 23 \times 10^{-3}$ (60~10$^6$ Hz, test method: ASTM D150). PBN with properties outside these ranges cannot be expected to produce significant reduction in the adhesion of resin.

By using PBN as described above as a carrier material, it is possible to reduce to a minimum adhesion of resin from a transporting carrier, or the like, during washing, conveyance and transportation of semiconductor wafers, principally, adhesion of resin due to contact between the wafers and carrier during spinner drying after washing. PBN has corrosion-resistant properties with respect to acids, such as hydrochloric acid, but it has poor corrosion resistance with respect to fluoric acid, and therefore the semiconductor wafer carrier according to the present invention is most appropriate for alkali washing, acid washing, and the like, which does not involve fluoric acid.

Using three types of wafer carrier: a conventional carrier manufactured from PFA and having the properties shown in Table 1, a comparison wafer carrier manufactured from PEEK (polyether etherketone) which has superior strength and thermal resistance to PFA, and a wafer carrier according to the present invention manufactured from PBN, a test was conducted wherein wafers were subjected to alkali washing two times, followed by drying in a spin-dryer, and were then transported over a prescribed distance.

In the case of the conventional wafer carrier, it was possible to confirm by visual inspection that resin was adhering to the carried wafers in many places. In the case of the comparison wafer carrier and the wafer carrier according to the present invention, no adhesion of resin could be confirmed by visual inspection. However, when examined through a microscope at 50 times magnification, places where resin was adhering to the wafers were confirmed in the case of the comparison wafer carrier, at approximately 10% of the level of adhesion in the conventional carrier, whilst in the case of the wafer carrier according to the present invention, no adhesion of resin on the wafers was observed.

TABLE 1

|  | Resistance to chemicals | Tensile strength (kg/mm$^2$) | Tensile elongation rate (%) | Thermal resistance (thermal deformation temperature) |
|---|---|---|---|---|
| PFA | Particularly good | 3.02 | 300 | 48° C. |
| PEEK | Particularly good | 9.3 | 150 | 152° C. |
| PBN | good | 660 | 87 | 76° C. |

The semiconductor wafer carrier according to the present invention allows adhesion of resin to be reduced to 10% or less compared to a conventional carrier, thereby enabling particle contamination related to adhesion of resin to be suppressed, and therefore it is suitable for a carrier for washing, conveying and transporting wafers after mirror polishing.

What is claimed is:

1. A carrier for supporting semiconductor wafers during washing, conveying and transporting comprising a PBN resin, wherein said PBN resin has a tensile elongation of 100% or less, and wherein an amount of adhesion of said PBN resin to a wafer due to contact between said PBN resin and said wafer is less than an amount of adhesion of a PFA resin to a wafer when utilizing a carrier formed from said PFA resin.

* * * * *